US000001035H

United States Statutory Invention Registration [19]

[11] Reg. Number: H1035

Haviland et al. [43] Published: Mar. 3, 1992

[54] NON-VOLATILE ANALOG MEMORY CIRCUIT WITH CLOSED-LOOP CONTROL

[75] Inventors: Gene L. Haviland, San Diego; Patrick A. Shoemaker, Lemon Grove; James R. Feeley; Alfons Tuszynski, both of San Diego, all of Calif.

[73] Assignee: The United States of America as represented by the Secretary of the Navy, Washington, D.C.

[21] Appl. No.: 541,235

[22] Filed: Jun. 20, 1990

[51] Int. Cl.[5] ..... G11C 27/00

[52] U.S. Cl. ..... 365/45; 365/185

[58] Field of Search ..... 365/45, 185, 184; 357/23.4, 23.5

[56] References Cited

U.S. PATENT DOCUMENTS

| | | | |
|---|---|---|---|
| 3,909,806 | 9/1975 | Echida | 365/45 |
| 4,054,864 | 10/1977 | Audaire et al. | 365/45 |
| 4,099,251 | 7/1978 | Minami | 364/829 |
| 4,181,980 | 1/1980 | McCoy | 365/45 |
| 4,200,841 | 4/1980 | Nagata et al. | 455/169 |
| 4,558,431 | 12/1985 | Satoh | 365/45 |
| 4,573,144 | 2/1986 | Countryman, Jr. | 365/185 |
| 4,595,999 | 6/1986 | Betirac | 365/45 |
| 4,627,027 | 12/1986 | Rai et al. | 365/45 |
| 4,686,558 | 8/1987 | Adam | 357/42 |
| 4,890,257 | 12/1989 | Simko | 365/45 |

*Primary Examiner*—Bernarr E. Gregory
*Attorney, Agent, or Firm*—Harvey Fendelman; Thomas Glenn Keough

[57] ABSTRACT

A non-volatile analog memory circuit includes charge depositing and storing circuitry, voltage sensing circuitry, and closed-loop control circuitry. The charge depositing and storing circuitry includes a floating gate operable to receive charge deposited on it. The voltage sensing circuitry supplies an analog output in response to the sensed gate potential. The closed-loop control circuitry is used to control charge deposition. The control circuitry is operable to change the charge on the gate by directing electrical pulses of appropriate polarity to the charge depositing and storing circuitry. This is done to diminish the error between the analog output signal of the charge sensing circuitry and an analog input signal for providing a substantially accurate representation of the analog input signal.

10 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

NON-VOLATILE ANALOG MEMORY CIRCUIT WITH CLOSED-LOOP CONTROL

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATION

This application is related to a copending U.S. patent application Ser. No. 07/405,498, filed Aug. 28, 1989, entitled "Dual Polarity Floating Gate MOS Analog Memory Device" by Ronald Reedy et al, commonly assigned to the assignee of the present application and hereby incorporated by reference.

BACKGROUND OF THE INVENTION

The present invention generally relates to analog memories and, more particularly, to a non-volatile analog memory circuit with closed-loop control.

One application of a non-volatile analog memory circuit is serving as a modifiable weight in an integrated circuit implementation of an adaptive "neural" network. Other applications of such a circuit include serving as a weight in an adaptive filter or other adaptive signal processing equipment, or for trimming offset voltages of differential amplifiers.

SUMMARY OF THE INVENTION

The present invention relates to a circuit which can serve as an analog memory (i.e., it is capable of storing an analog value in a continuous range) that is long-term, non-volatile (i.e., it does not lose the value when power is removed from the circuit), and controllably modifiable. The circuit will allow setting, adjustment, and long-term, non-volatile storage of analog values for use in analog circuitry.

In accordance with the present invention, the circuit includes charge depositing and storing circuitry, which may, for example, be embodied in the form of a pair of complementary metal-oxide-silicon (MOS) writing transistors and a memory cell in the form of common floating MOS gate, the writing transistors sharing the floating gate and operable to deposit charge on the gate by the mechanism of hot carrier injection. The circuit also includes charge sensing circuitry which shares the floating gate and produces an analog output signal in response to the injected charge on the gate. The circuit further includes closedloop control circuitry for controlling the charge deposition. The control circuitry is operable to change the charge on the gate by directing electrical pulses of appropriate polarity to the charge-injecting circuitry. This is done to diminish the error between the analog output signal of the charge sensing circuitry and an analog input signal to the control circuitry for providing substantially accurate storage of the analog input signal on the gate.

OBJECTS OF THE INVENTION

Accordingly, it is the primary object of the present invention to disclose a non-volatile analog memory circuit which can function to deposit and store charge representing an analog value.

Another object of the present invention is to disclose a non-volatile analog memory circuit which can function to sense the deposited charge.

Still another object of the present invention is to disclose a non-volatile analog memory circuit which can function to accomplish closed-loop control of the charge deposition.

Other objects, advantages and novel features of the invention will become apparent from the following detailed description of the invention when considered in conjunction with the accompanying drawings.

DETAILED DESCRIPTION OF THE INVENTION

Figure 1:
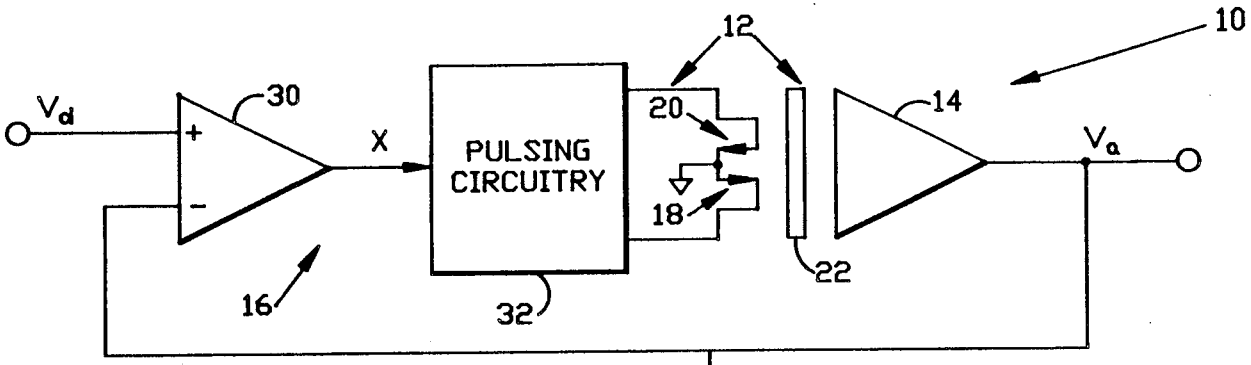
FIG. 1 is a schematic diagram of a non-volatile analog memory circuit in accordance with the present invention.

Referring now to the drawings, and particularly to FIG. 1, there is shown a non-volatile analog memory circuit, generally designated 10, in accordance with the present invention. Non-volatile analog memory circuit 10 is only illustrated herein in a general schematic diagram since its components individually (but not in the disclosed arrangement) are well understood and can be constructed in integrated circuit form by one of ordinary skill in the art without undue experimentation. Thus, to illustrate analog memory circuit 10 in greater detail herein would only serve to increase the complexity of the explanation of the circuit without adding to its clarity.

Non-volatile analog memory circuit 10 includes three principal parts: charge depositing and storing circuitry 12, charge sensing circuitry 14, and closed-loop control circuitry 16. The embodiment of the charge depositing and storing circuitry 12 illustrated in FIG. 1 is in the form of a pair of complementary metal-oxide-silicon (CMOS) devices 18 and 20 and floating MOS gate 22 shared by the writing devices. The writing devices 18 and 20 are operable to deposit charge on gate 22 which, in turn, can store the charge. Charge sensing circuitry 14 also shares floating gate 22 with writing devices 18 and 20. Charge sensing circuitry 14 is operable to sense the charge stored on gate 22. Closed-loop control circuitry 16 provides closed-loop control of the deposition of charge by writing devices 18 and 20 onto floating gate 22.

More particularly, writing devices 18 and 20 of circuit 10 are respective complementary p-channel and n-channel MOS transistors sharing common floating MOS gate 22 and each being operable in a charge-injecting mode to deposit charge on gate 22. Gate 22, in effect, is the memory cell of circuit 10. It is electrically isolated from other circuitry as by $SiO_2$. Gate 22 overlays the channels of complementary MOS transistors 18 and 20, which are used to deposit charge on the gate by the mechanism of hot carrier injection through the gate oxide, and thus change the potential of the gate.

A sufficiently large negative voltage applied to p-channel MOS transistor 18 will result in the injection of electrons on gate 22, while a sufficiently large positive voltage applied to n-channel MOS transistor 20 will result in the injection of holes on gate 22. An "increment" means an increase in potential of the storage site, i.e., addition of positive charge or removal of negative charge; conversely, a "decrement" means a decrease in potential. Preferably, these voltages are applied in the form of pulses generated by a component of closed-loop control circuitry 16 described below. The net charge may thus be of either polarity, and may be changed in either direction, positive or negative to thereby increment or decrement the storage site potential. The charge may be retained on the insulated gate 22 for long periods of time (up to years) after injection.

The charge depositing and storing circuitry 12 described above constitutes a complementary FAMOS (Floating-gate Avalanche-injection MOS) circuit. However, it is to be understood that other forms of charge depositing and storing circuitry may also be employed and fall within the scope of the invention, subject to the condition that they permit bipolar programming, in the sense that net charge on the floating gate may be either increased or decreased. An example of such an alternative charge depositing and storing circuit is illustrated in FIG. 2C and includes double-gate structure 25 having floating gate 29 and control gate 31 as is used in EEPROMs (Electrically Erasable Programmable Read-Only Memories).

Charge sensing circuitry 14 also shares floating MOS gate 22 with writing devices 18 and 20 and responds to the potential of the gate due to charge injected thereon by the writing devices to supply an analog output voltage signal $V_a$. Preferably, charge sensing circuitry 14 employs another MOS transistor or transistors for sensing the gate potential due to the injected charge. The analog output signal $V_a$ supplied by circuitry 14 is based upon the gate charge or potential.

Figure 2B:
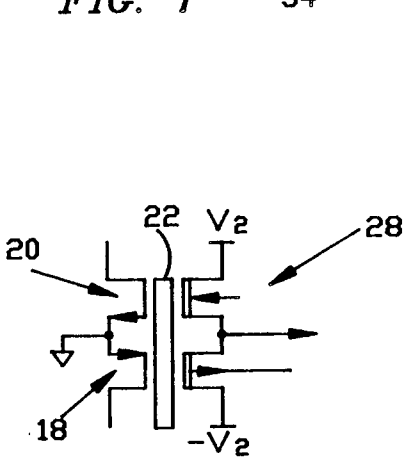
FIG. 2B is a schematic diagram of another implementation of the charge sensing circuitry of the circuit of FIG. 1.
Figure 2C:
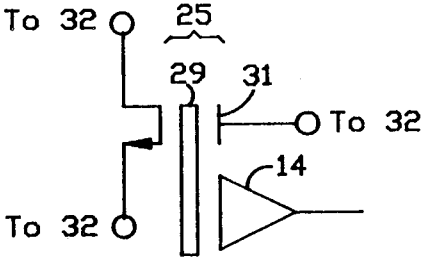
FIG. 2C is a schematic diagram of an alternate embodiment of the charge depositing and storing circuit of the present invention.
Figure 2A:
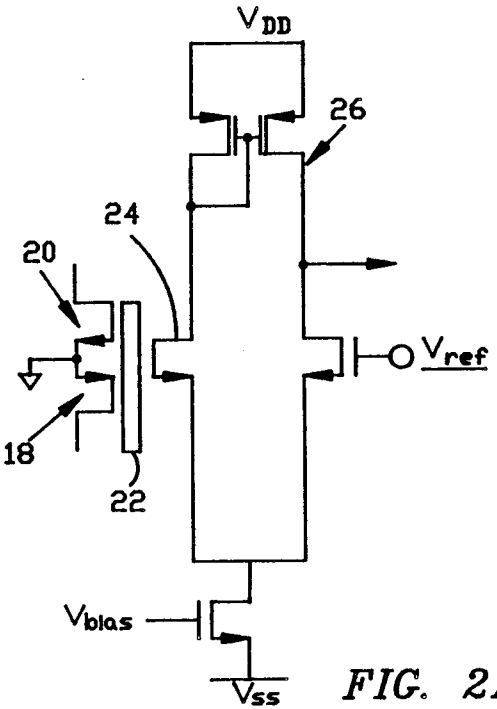
FIG. 2A is a schematic diagram of one implementation of the charge depositing and storage circuit and sensing circuitry of FIG. 1.

An alternative implementation of charge sensing circuitry 14 is illustrated in FIG. 2A. In FIG. 2A, input transistor 24 of a transconductance differential amplifier stage shares floating gate 22. This circuit could form the input stage of a more elaborate charge sensing amplifier. Such an amplifier would produce an output directly related to the potential of the floating gate 22, relative to $V_{ref}$ in FIG. 2A.

Another implementation of charge sensing circuitry 14 is shown in FIG. 2B. In this implementation, floating gate 22 overlays the channels of a complementary depletion-mode multiplier 28. Such a circuit is disclosed in U.S. Pat. No. 4,906,873 issued to Patrick A. Shoemaker and commonly assigned to the assignee of the present application. This implementation of circuitry 14 will supply an analog output proportional to the product of the gate potential and voltage $V_2$.

Alternatively, charge sensing circuitry may be implemented within the scope of this invention by any circuit which can provide an output which depends in a monotonic fashion on the potential of the floating gate.

Closed-loop control circuitry 16 of circuit 10 is provided for controlling deposition of charge on gate 22. Floating gate 22 is controlled by closed-loop control circuitry 16. Closed-loop control circuitry 16 is operable to change the charge on gate 22 by directing electrical pulses of appropriate polarity to the charge-injecting or writing devices 18 and 20 in order to diminish the error between the analog output signal $V_a$ of charge sensing circuitry 14 and an analog input signal $V_d$ for providing substantially accurate storage of the analog input signal $V_d$ on the gate.

More particularly, closed-loop control circuitry 16 includes subtracting circuitry 30, pulsing circuitry 32 controlled by subtracting circuitry 30 and with output pulses directed to writing devices 18 and 20, and feedback circuitry 34 connecting the output of charge sensing circuitry 14 with an input of subtracting circuitry 30. When the analog memory value is to be set, the desired value, the analog input signal $V_d$, is applied to one input of subtracting circuitry 30, being in the form of a differential amplifier. The analog output signal $V_a$ of charge sensing circuitry 14 is applied to the other input of subtracting circuitry 30 which then supplies an output X which varies monotonically with the difference, $V_d - V_a$, of the analog signals.

Pulsing circuitry 32 receives output X of subtracting circuitry 30 and performs one of the following actions based upon the following conditions:

(1) If $|X| < e$, then neither writing transistor 18 nor 20 receives writing pulses.

(2) If $X > e$, then no writing pulses are applied to the p-channel writing transistor 18 while positive-going writing pulses are applied to the drain of n-channel writing transistor 20 under the condition of (1) above is met.

(3) If $X < -e$, then no writing pulses are applied to n-channel writing transistor 20 while negative-going writing pulses are applied to the drain of p-channel writing transistor 18 until the condition of (1) above is met.

The value "e" is a small positive constant which defines a predetermined acceptable error value and thus determines when writing pulses are to be applied. The writing pulses are of sufficient amplitude to cause charge injection on floating gate 22 throughout the operating range of the memory cell. The charge injection changes the gate potential in such a way that $V_a$ approaches pulses $V_d$; continue until the condition (1), $|X| < e$, is met. The time duration between individual pulses is such that all circuitry has sufficient time to stabilize at the adjusted value of $V_a$ after each pulse. The duration and amplitude of the pulses determine the dynamic range of the memory, while the magnitude of the static error between $V_d$ and $V_a$ depends upon the value of the parameter e.

Figure 3:
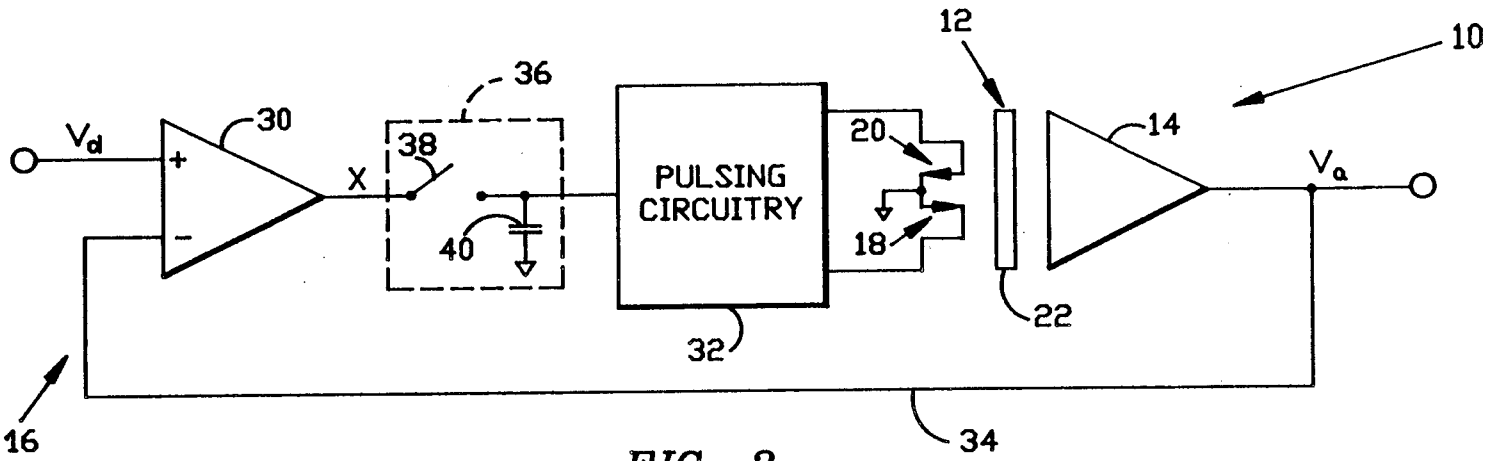
FIG. 3 is a schematic diagram of a modified embodiment of the circuit of FIG. 1.

Referring now to FIG. 3, the process of charge injection onto floating gate 22 may have an undesirable side effect which can be resolved in accordance with the present invention by means of the modification to circuit 10 illustrated in this figure. In addition to injecting charge, a pulse from pulsing circuitry 32 can result in a further change in gate potential during its application, which is due to capacitive coupling. This potential is present only for the duration of the pulse and is spurious as far as the value of the analog memory is concerned. However, the spurious value can propagate back through the closed-loop control circuitry 16 and affect its operation.

Therefore, as seen in FIG. 3, sample and hold circuitry 36 is incorporated by control circuitry 16 to eliminate the effects of the spurious electrostatic potential on feedback control. Sample and hold circuitry 36 includes switch 38 and capacitor 40 interposed between subtracting circuitry 30 and pulsing circuitry 32 as shown in FIG. 3. Control circuitry associated with switch 38 is not shown but would be readily understood by one of ordinary skill in the art. Switch 38 is preferably solid state.

When a pulse is to be applied to one of the writing devices 18 and 20, switch 38 is opened, storing output X (assumed to be a voltage) on capacitor 40. This effectively breaks the feedback loop of control circuitry 16 and assures that a writing pulse is applied for its full duration after it is initiated and that the effects of the spurious potential are eliminated. Between writing pulses, switch 38 is closed to transfer the updated value of X to capacitor 40. When the analog memory value is set and is to remain fixed, pulsing circuitry 32 and/or subtracting circuitry 30 are disabled, effectively breaking the closed loop.

Figure 4:
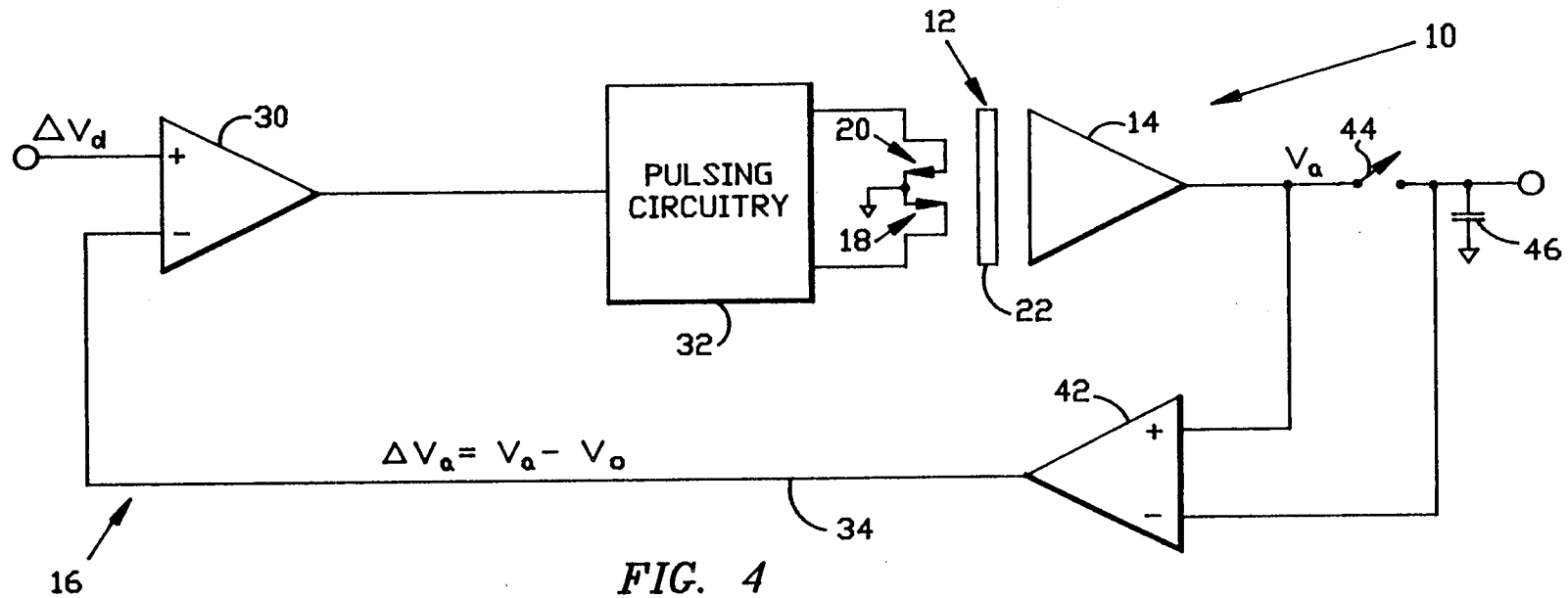
FIG. 4 is a schematic diagram of another modified embodiment of the circuit of FIG. 1.

Referring to FIG. 4, another modification of circuit 10 provides second subtracting circuitry 42 in the form of a differential amplifier, second switch 44, and second capacitor 46 in conjunction with feedback circuitry 34 of the closed-loop control circuitry 16. With this modification, increments of the analog memory value are controlled, rather than the value itself. The output of charge sensing circuitry 14 is assumed to be a voltage in this case. When the memory cell of gate 22 is to be modified, second switch 44 is opened, storing old memory value $V_o$ on second capacitor 46, and a desired change in the memory value $\Delta V_d$ is applied at subtracting circuitry 30. The actual change in the analog memory value, $\Delta V_a$, is computed by second subtracting circuitry 42 as the difference, $V_a - V_o$, where $V_a$ is the current value as provided by charge sensing circuit 14. Subtracting circuitry 30 supplies an output proportional to the difference, $\Delta V_d - \Delta V_a$. The remainder of the circuit 10 operates in the same manner as in FIG. 1, but with the result that $\Delta V_a$ is made to approach $\Delta V_d$ by the process of charge injection via the appropriate one of the transistors 18 and 20. As before, pulsing circuitry 32 and/or subtracting circuitry 30 are disabled when the memory value is to remain fixed, and second switch 44 is then closed as well.

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages, the forms hereinbefore described being merely exemplary embodiments thereof.

Having thus described the invention, what is claimed is:

1. A non-volatile analog memory circuit comprising:

(a) charge depositing and storing circuitry including a memory cell having a floating gate capable of storing electrical charge, said circuitry being operable in a manner which allows either an increment or decrement to be made to stored charge on said memory cell;

(b) charge sensing circuitry operably coupled to said memory cell and including said floating gate as a part thereof and in response to the charge on said memory cell supplying an analog output signal representative of the stored charge; and (c) closed-loop control circuitry for controlling operation of said charge depositing and storing circuitry by deposition of charge on said memory cell.

2. The circuit of claim 1 wherein said control circuitry is operable to change the charge on said memory cell in order to diminish any difference between the analog output signal of said charge sensing circuitry and an analog input signal to said closed loop control circuitry, for providing a substantially accurate representation of the analog input signal by means of the charge stored upon said memory cell.

3. The circuit of claim 2 wherein said charge depositing and storing circuitry includes a pair of writing devices operably coupled with said memory cell and each being operable in a charge-injecting mode to deposit charge on said memory cell.

4. The circuit of claim 3 wherein said writing devices are a pair of complementary metal-oxide-silicon (CMOS) transistors including said common floating gate.

5. The circuit of claim 4 wherein said control circuitry is operable to change the charge on said floating gate by directing at least one electrical pulse to a respective one of said charge-injecting MOS transistors.

6. The circuit of claim 2 wherein said control circuitry is operable to change the charge on said memory cell by directing at least one electrical pulse to said charge depositing and storing circuitry.

7. The circuit of claim 6 wherein said control circuitry includes:

subtracting circuitry having a first and a second input each for receiving analog signals and an output and being operable to produce an analog error signal on said output thereof proportional to a difference between said analog signal supplied on said second input and said analog input supplied on said first input;

pulsing circuitry connected between said subtracting circuitry and said charge depositing and storing circuitry; and feedback circuitry connecting an output of said charge sensing circuitry with said first input of said subtracting circuitry such that when an analog value is to be set in said memory cell, the desired analog value in the form of an analog input signal is applied to said second input of said subtracting circuitry and said analog output signal of said charge sensing circuitry is applied to said first input of said subtracting circuitry whereupon in response to the application of said analog input and output signals, said substracting circuitry supplies said analog error signal to said pulsing circuitry.

8. The circuit of claim 7 wherein said pulsing circuitry in response to receipt of said analog error signal is operable to perform one of the following actions based on the following conditions: (i) if the absolute value of said analog error signal is less than a predetermined acceptable error value, then no pulse is applied to said charge depositing and storing circuitry; (ii) if said analog error signal is greater than said predetermined acceptable error value, then one or more pulses are applied to said charge depositing and storing circuit so as to increase said analog output signal until the condition of (i) is met; or (iii) if said analog error signal is less than the negative of said predetermined acceptable error value, then one or more pulses are applied to said charge depositing and storage circuitry so as to decrease said analog output signal until the condition of (i) is met.

9. The circuit of claim 7 wherein:

said analog error signal is a monotonic function of the difference between said analog input and output signals for causing operation of said pulsing circuitry in controlling said charge depositing and storing circuitry in setting the charge on said memory cell.

10. The circuit of claim 2 wherein said charge depositing and storing circuitry comprises a double gate structure wherein one of said gates is a floating gate.

* * * * *